United States Patent
Wu

(10) Patent No.: US 6,654,246 B2
(45) Date of Patent: Nov. 25, 2003

(54) HEAT SINK ASSEMBLY WITH FIXING MEMBERS

(75) Inventor: Wow Wu, Shenzhen (CN)

(73) Assignee: Hon Hai Precision Ind. Co. Ltd., Taipei Hsien (TW)

(*) Notice: Subject to any disclaimer, the term of this patent is extended or adjusted under 35 U.S.C. 154(b) by 0 days.

(21) Appl. No.: 10/155,293

(22) Filed: May 23, 2002

(65) Prior Publication Data

US 2003/0184971 A1 Oct. 2, 2003

(51) Int. Cl.$^7$ ................................................ H05K 7/20
(52) U.S. Cl. .................... 361/697; 24/458; 165/121; 415/177
(58) Field of Search ................. 257/718, 719, 257/722, 726, 727; 361/687, 695, 697, 703, 704, 709–712, 717–720; 454/184; 312/236; 415/177, 178, 213.1, 214.1; 165/80.3, 185, 121–126; 174/16.3; 24/453, 457, 458; 248/505, 510

(56) References Cited

U.S. PATENT DOCUMENTS

| | | | | |
|---|---|---|---|---|
| 5,594,623 A | * | 1/1997 | Schwegler | 361/697 |
| 5,740,017 A | * | 4/1998 | Horng | 361/704 |
| 6,017,185 A | * | 1/2000 | Kuo | 415/177 |
| 6,062,301 A | * | 5/2000 | Lu | 165/80.3 |
| 6,118,657 A | * | 9/2000 | Clemens | 361/697 |
| 6,407,920 B1 | * | 6/2002 | Jui-Yuan et al. | 361/697 |
| 6,449,152 B1 | * | 9/2002 | Lin | 361/697 |
| 6,507,491 B1 | * | 1/2003 | Chen | 361/697 |

* cited by examiner

Primary Examiner—Gerald Tolin
(74) Attorney, Agent, or Firm—Wei Te Chung

(57) ABSTRACT

A heat sink assembly includes a fan (10), two fixing members (20), a heat sink (30), and a plurality of screws (40, 50). The fan is generally parallelepiped, and defines four mounting holes (102) in corners thereof. Each fixing member has a first plate (202) defining a pair of first fixing holes (212), and a second plate (204) extending perpendicularly from a top edge of the first plate. An ear (203) defining a second fixing hole (214) corresponding to one of the mounting holes of the fan extends from each of opposite ends of the second plate. A pair of locking holes (302) is defined in a top portion of an outmost fin (304) at each of opposite sides of the heat sink, corresponding to the first fixing holes of one of the fixing members. The fan, the fixing members and the heat sink are fastened together by the screws.

5 Claims, 2 Drawing Sheets

HEAT SINK ASSEMBLY WITH FIXING MEMBERS

BACKGROUND OF THE INVENTION

1. Field of the Invention

The present invention relates to heat sink assemblies, and particularly to a heat sink assembly attaching a fan to a heat sink.

2. Description of Prior Art

Central processing units (CPUs) are essential for modern computers to process information efficiently. Performance of a computer as a whole very much depends on performance of the computer's CPU. Thus modern computers feature CPUs that operate at very high frequencies and speeds. However, high frequency and high speed cause a CPU to produce copious amounts of heat. To ensure that a CPU can operate normally, a heat sink assembly is generally fixed on a surface of the CPU to continuously dissipate heat from the CPU.

Examples of conventional heat sink assemblies are disclosed in U.S. Pat. No. 5,594,623 and Taiwan patent No. 435744. A fixing member for a fan in a heat sink assembly is generally cuboid, and has a round ventilating hole defined therein. Opposite sides of the fixing member extend to a base of a heat sink, to retainingly cover the whole heat sink assembly including a fan. However, the cost of materials of the assembly is unduly high. In addition, because the fixing member entirely covers the fan, the fixing member retards airflow. Therefore the efficiency of heat removal is reduced.

An improved heat sink assembly which overcomes the above-mentioned problems is desired.

BRIEF SUMMARY OF THE INVENTION

Accordingly, an object of the present invention is to provide a heat sink assembly which readily attaches a fan to the heat sink.

Another object of the present invention is to provide a heat sink assembly which allows optimum airflow.

A further object of the present invention is to provide a heat sink assembly which is inexpensive.

To achieve the above-mentioned objects, a heat sink assembly of the present invention comprises a fan, two fixing members, a heat sink and a plurality of screws. The fan is generally parallelepiped, and defines four mounting holes in four corners thereof respectively. Each fixing member has a first plate and a second plate. The second plate integrally extends perpendicularly inwardly from a top edge of the first plate. An ear extends coplanarly inwardly from each of opposite ends of the second plate. A pair of spaced first fixing holes is defined in the first plate. A second fixing hole is defined in each ear of the second plate, corresponding to a respective one of the mounting holes of the fan. A pair of spaced locking holes is defined in a top portion of an outmost fin at each of opposite sides of the heat sink. The locking holes of the outmost fins correspond to the first fixing holes of the fixing members. Four screws are inserted through the first fixing holes and engaged in the locking holes, thereby fastening the fixing members to the heat sink. Four more screws are inserted through the mounting holes and engaged in the second fixing holes, thereby fastening the fan to the fixing members.

Other objects, advantages and novel features of the present invention will be drawn from the following detailed description of a preferred embodiment of the present invention with the attached drawings, in which:

DETAILED DESCRIPTION OF THE INVENTION

Figure 1:
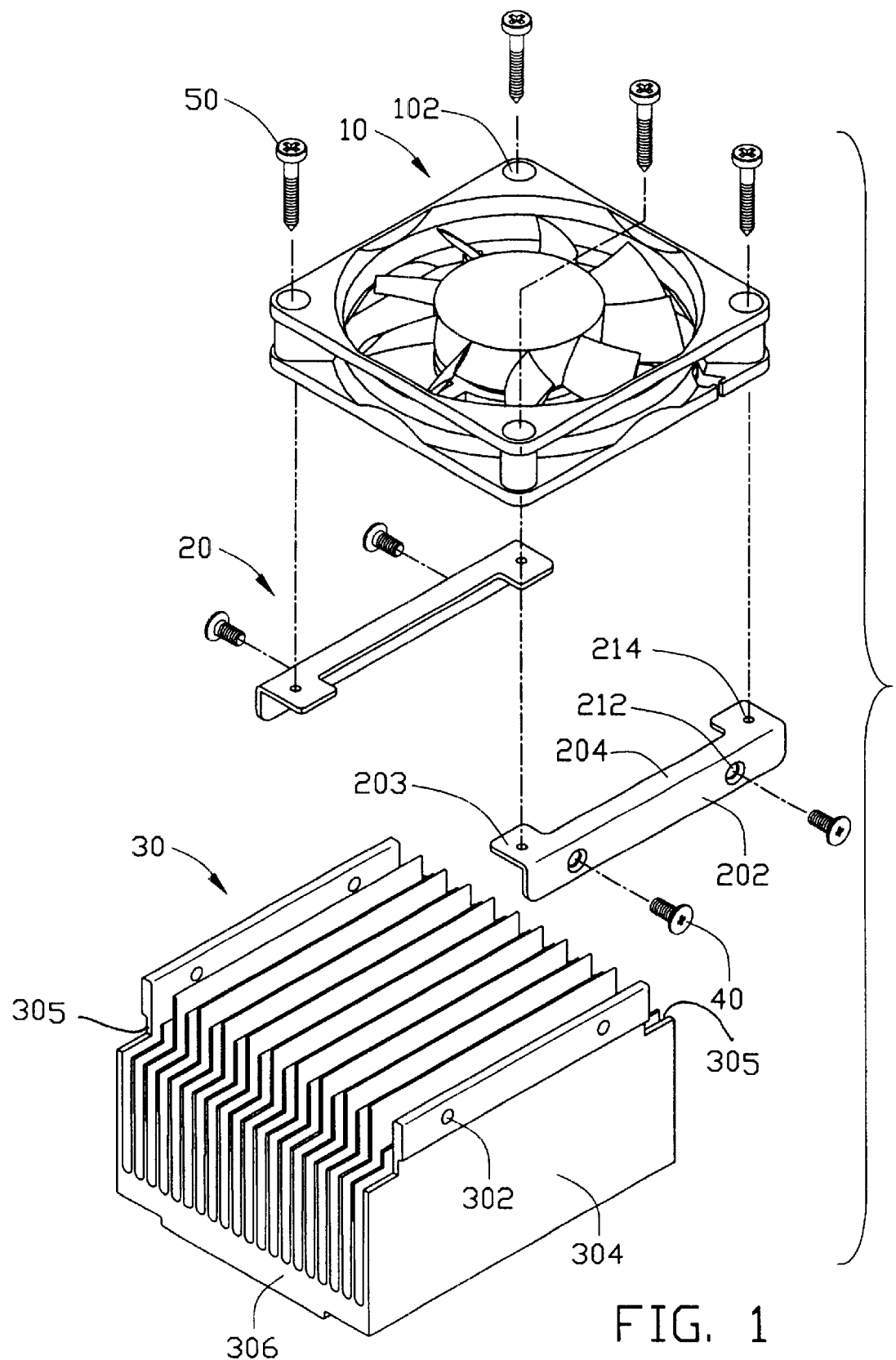
FIG. 1 is an exploded perspective view of a heat sink assembly in accordance with a preferred embodiment of the present invention.

Referring to FIG. 1, a heat sink assembly in accordance with a preferred embodiment of the present invention comprises a fan 10, two fixing members 20 and a heat sink 30. The fan 10 is generally parallelepiped, and defines four mounting holes 102 in four corners thereof respectively. Four fasteners are inserted into the mounting holes 102 to attach the fan 10 to the fixing members 20 (described in detail below). In the preferred embodiment, the fasteners are screws Each fixing member 20 has a first plate 202 and a second plate 204. The second plate 204 integrally extends perpendicularly inwardly from a top edge of the first plate 202. An ear 203 extends coplanarly inwardly from each of opposite ends of the second plate 204. A pair of spaced first fixing holes 212 is defined in the first plate 202. A second fixing hole 214 is defined in each ear 203 of the second plate 204, corresponding to one of the mounting holes 102 of the fan 10.

The heat sink 30 comprises a base 306, and a plurality of parallel fins 304 extending upwardly from the base 306 wherein top portions of fins at two opposite lengthwise ends are removed to form two shoulders 305, around two opposite lengthwise ends of the fins, for increasing ventilation in a vertical direction and in a horizontal direction which is perpendicular to both a lengthwise direction of the fins and the vertical direction. A pair of spaced locking holes 302 is defined in a top portion of an outmost fin 304 at each of opposite sides of the heat sink 30. The locking holes 302 of the two outmost fins 304 correspond to the first fixing holes 212 of the fixing members 20. Four fasteners are inserted into the first fixing holes 212 and locking holes 302, to attach the fixing members 20 to the heat sink 30. In the preferred embodiment, the fasteners are screws 40.

Figure 2:
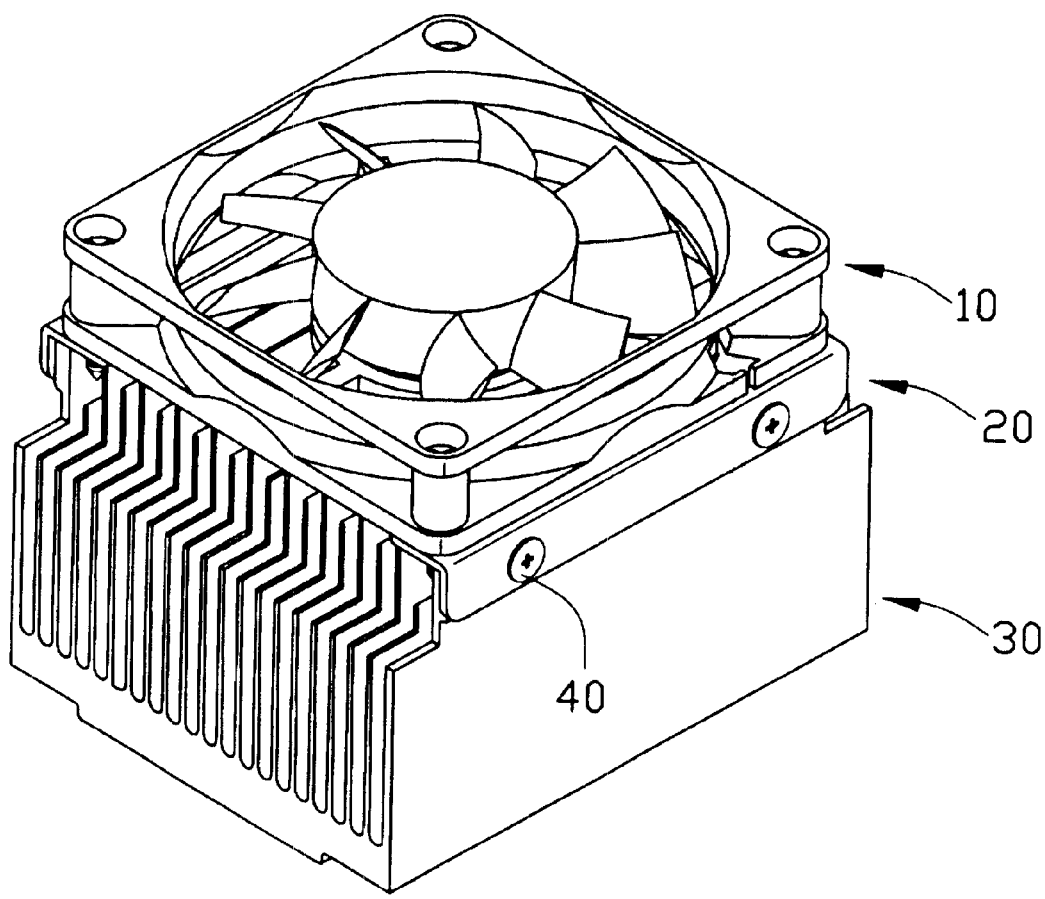
FIG. 2 is an assembled view of FIG. 1.

Referring also to FIG. 2, in assembly, the fixing members 20 are placed on the heat sink 30, with the first fixing holes 212 of the fixing members 20 aligning with the locking holes 302 of the heat sink 30. The screws 40 are inserted through the first fixing holes 212 and engaged in the locking holes 302, thereby fastening the fixing members 20 to the heat sink 30. The fan 10 is placed on the fixing members 20, with the mounting holes 102 of the fan 10 aligning with the second fixing holes 214 of the fixing members 20. The screws 50 are inserted through the mounting holes 102 and engaged in the second fixing holes 214, thereby fastening the fan 10 to the fixing members 20. Thus the fan 10, the fixing members 20 and the heat sink 30 are all securely fastened together.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly comprising:

a heat sink including a base with a plurality of fins extending upwardly therefrom;

two outermost fins defining a larger thickness around top portions thereof than other fins between said two outermost fins;

two discrete fixing members respectively attached to the top portions of said two outermost fins; and a fan attached to and on top of said two fixing members.

2. The assembly as described in claim 1, wherein said fixing members are secured to the corresponding fins via screws in a horizontal direction.

3. The assembly as described in claim 1, wherein said fan is secured to the fixing members via screws in a vertical direction.

4. A heat sink assembly comprising:

a heat sink including a base with a plurality of fins upwardly extending therefrom along a lengthwise direction thereof;

a pair of shoulders being formed around top portions of fins around two opposite lengthwise ends thereof for increasing ventilation in a vertical direction and a horizontal direction perpendicular to said lengthwise direction;

a pair of discrete fixing members attached to the top portions of the two outermost fins; and a fan assembled on a top of said two fixing members; wherein a dimension of said fan does not exceed beyond the shoulders in the lengthwise direction of the fins.

5. The heat sink assembly as described in claim 4, wherein the shoulders are formed by removing the top portions of the fins.

* * * * *